(12) United States Patent
Wright et al.

(10) Patent No.: US 8,780,503 B2
(45) Date of Patent: Jul. 15, 2014

(54) MULTI-LAYER PIEZOELECTRIC TRANSDUCER WITH INACTIVE LAYERS

(71) Applicant: Seagate Technology LLC, Cupertino, CA (US)

(72) Inventors: John S. Wright, Edina, MN (US); Razman Zambri, Eden Prairie, MN (US)

(73) Assignee: Seagate Technology LLC, Cupertino, CA (US)

( * ) Notice: Subject to any disclaimer, the term of this patent is extended or adjusted under 35 U.S.C. 154(b) by 51 days.

(21) Appl. No.: 13/652,907

(22) Filed: Oct. 16, 2012

(65) Prior Publication Data
US 2014/0104722 A1 Apr. 17, 2014

(51) Int. Cl.
G11B 5/48 (2006.01)

(52) U.S. Cl.
USPC ............................................ 360/294.4

(58) Field of Classification Search
USPC .......... 360/294.4, 294.3, 294.1, 294.7, 294.6, 360/294.2
See application file for complete search history.

(56) References Cited

U.S. PATENT DOCUMENTS

| | | | |
|---|---|---|---|
| 5,237,239 A | 8/1993 | Inoue et al. | |
| 5,245,734 A | 9/1993 | Issartel | |
| 5,410,210 A | 4/1995 | Sato et al. | |
| 5,459,371 A | 10/1995 | Okawa et al. | |
| 6,414,417 B1 | 7/2002 | Tsuyoshi et al. | |
| 6,668,437 B1 | 12/2003 | Maruyama et al. | |
| 6,700,306 B2 | 3/2004 | Nakamura et al. | |
| 7,402,937 B2 | 7/2008 | Sugg | |
| 7,429,817 B2 | 9/2008 | Asano et al. | |
| 7,498,718 B2 | 3/2009 | Vogeley | |
| 7,745,981 B2 | 6/2010 | Omura et al. | |
| 8,004,155 B2 | 8/2011 | Nakamura | |
| 8,080,919 B2 | 12/2011 | Glazunov | |
| 8,129,883 B2 | 3/2012 | Hamann et al. | |
| 8,169,123 B2 | 5/2012 | Osawa | |
| 2002/0043901 A1 | 4/2002 | Kihara et al. | |
| 2010/0142097 A1* | 6/2010 | Kawano | 360/245.8 |
| 2010/0243297 A1* | 9/2010 | Oosawa et al. | 174/251 |
| 2010/0276511 A1* | 11/2010 | Okamura | 239/102.2 |
| 2011/0115341 A1* | 5/2011 | Birkmeyer et al. | 310/364 |
| 2013/0201581 A1* | 8/2013 | Nishiyama et al. | 360/234.3 |
| 2013/0271874 A1* | 10/2013 | MIURA et al. | 360/234.3 |
| 2013/0300806 A1* | 11/2013 | Nakayama | 347/68 |

* cited by examiner

Primary Examiner — Allen T Cao
(74) Attorney, Agent, or Firm — Hall Estill Attorneys at Law

(57) ABSTRACT

Apparatus for positioning a control object, such as a micro-actuator used to position a read/write transducer adjacent a data storage medium. In accordance with some embodiments, a piezoelectric transducer (PZT) element is adapted to induce rotational displacement of the control object in a bending mode of operation. The PZT element has a plurality of piezoelectric material layers and a plurality of electrically conductive layers interposed between the piezoelectric material layers. The piezoelectric material layers include a first subset of active layers and at least one non-active layer.

20 Claims, 7 Drawing Sheets

MULTI-LAYER PIEZOELECTRIC TRANSDUCER WITH INACTIVE LAYERS

SUMMARY

Various embodiments of the present disclosure are generally directed to an apparatus for positioning a control object, such as a microactuator used to position a read/write transducer adjacent a data storage medium.

In accordance with some embodiments, a piezoelectric transducer (PZT) element is adapted to induce rotational displacement of the control object in a bending mode of operation. The PZT element has a plurality of piezoelectric material layers and a plurality of electrically conductive layers interposed between the piezoelectric material layers. The piezoelectric material layers include a first subset of active layers and at least one non-active layer.

These and other features and aspects which characterize various embodiments of the present invention can be understood in view of the following detailed discussion and the accompanying drawings.

DETAILED DESCRIPTION

The present disclosure generally relates to the positioning of a control object using a piezoelectric transducer (PZT) element which undergoes a bending mode of operation to rotate the control object.

Data storage devices can be provisioned with a rotatable medium to which data are stored along a number of concentric tracks. A head gimbal assembly (HGA) allows precise positioning of a data read/write transducer adjacent the tracks by allowing the transducer to gimbal along multiple axes to follow the topography of the media surface.

Microactuators have been proposed for use with HGAs to reduce resonance modes of the assemblies and to provide second order positional control capabilities (first order control being supplied by a swing arm actuator or the like). Microactuators can be formed from piezoelectric transducers (PZTs) to induce controlled rotation of an HGA data transducer.

PZT elements generally operate to mechanically expand or retract responsive to application of electrical voltage. PZT elements can be formed of various crystalline, ceramic and polymeric materials such as but not limited to silicon tetraoxide, ($SiO_4$ i.e., "quartz"), barium titanate ($BaTiO_3$) and zinc oxide (ZnO).

A collocated microactuator design uses a pair of spaced apart, cantilevered PZT elements on opposing sides of a transducer. Controlled application of voltage to the PZT elements can cause one of the elements to contract and the other element to expand, thereby inducing rotation (torque) in the transducer as the elements bend about a central rotation point.

While operable, limitations associated with such microactuators include limited displacement capabilities, relatively high power consumption requirements, relatively low reliability and complex manufacturing requirements.

Accordingly, various embodiments disclosed herein are generally directed to a microactuator assembly having an improved PZT element construction. As explained below, the PZT element has a laminated structure made up of a plurality of active PZT material layers and at least one non-active PZT material layer. It has been found that using at least one non-active PZT material layer enhances bending mode operation of the element.

Figure 1:
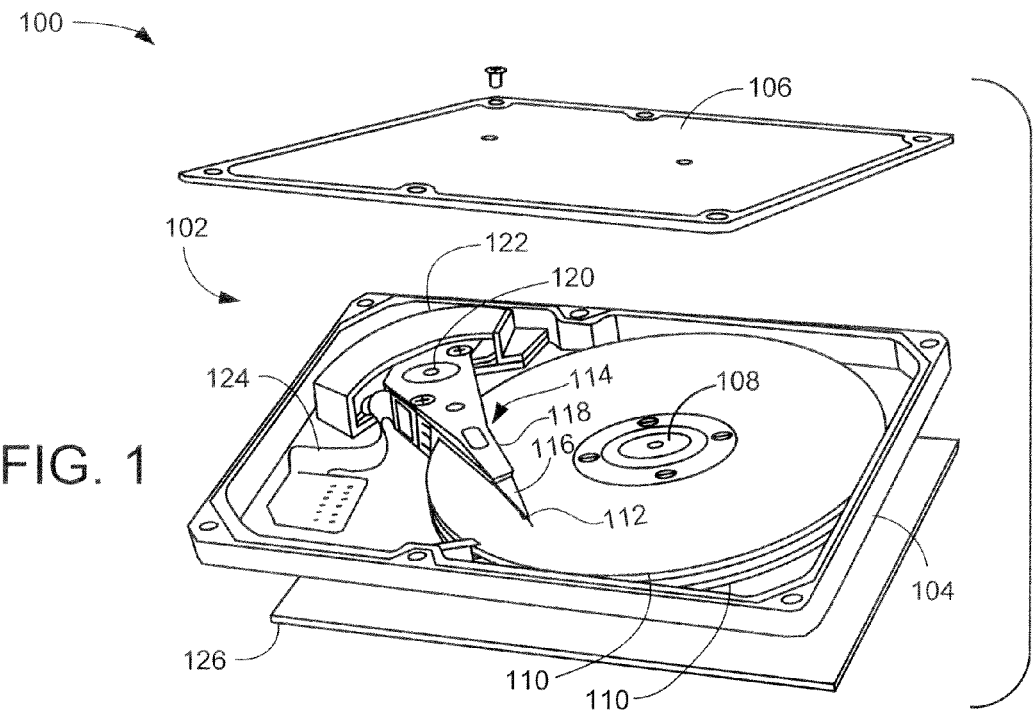
FIG. 1 provides an exploded view of an exemplary data storage device.

FIG. 1 provides a top perspective view of a disc drive data storage device 100. The device 100 is provided to show an exemplary environment in which various embodiments of the present disclosure can be advantageously practiced. It will be understood that the present disclosure is not so limited, but rather can be adapted to any number of environments in which a control object is positioned using a PZT element.

The device 100 includes a sealed housing 102 formed from a base deck 104 and top cover 106. An internally disposed spindle motor 108 is configured to rotate a number of storage media 110. The media 110 are accessed by a corresponding array of data transducers that are each supported by a head gimbal assembly (HGA) 112. While FIG. 1 shows the use of two magnetic recording discs and four corresponding heads, other numbers of heads and discs (such as a single disc, etc.) and other types of media (such as optical media, etc.) can alternatively be utilized as desired.

Each HGA 112 is preferably supported by a head-stack assembly 114 ("actuator") that includes a flexible suspension assembly 116, which in turn is supported by a rigid actuator arm 118. The actuator 114 preferably pivots about a cartridge bearing assembly 120 through application of current to a voice coil motor (VCM) 122. In this way, controlled operation of the VCM 122 causes the transducers of the HGA 112 to align with tracks (not shown) defined on the media surfaces to store data thereto or retrieve data therefrom.

A printed circuit cable 124 facilitates electrical communication between the actuator 114 and device control electronics on an externally disposed device printed circuit board (PCB) 126. The printed circuit cable 124 can comprise multiple circuits that allow communication of several different components of the data storage device 100 with the PCB 126.

Figure 2:
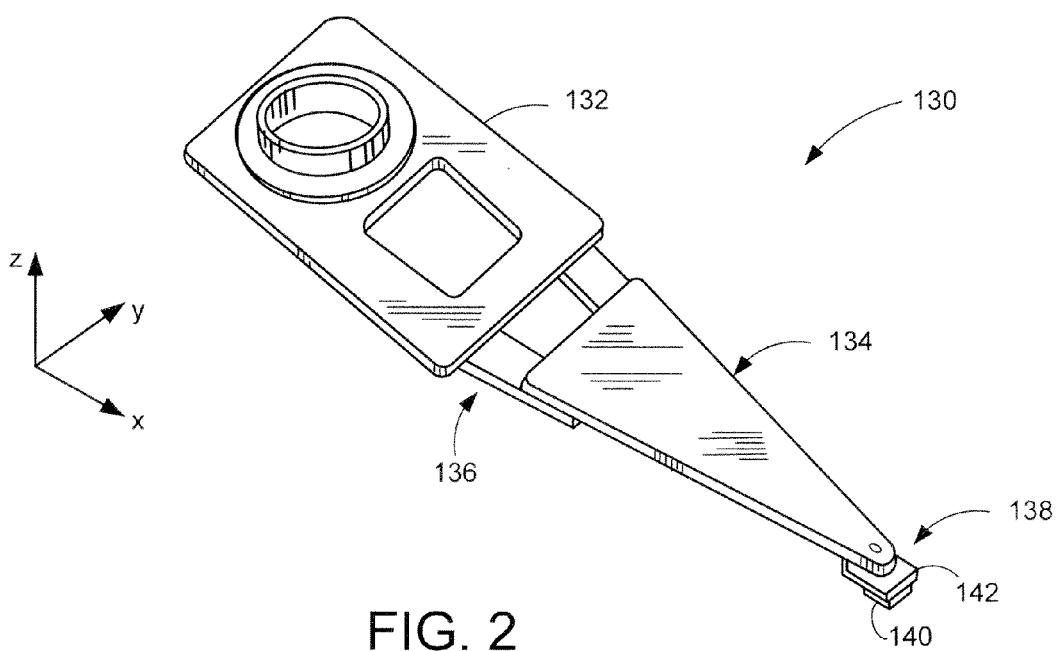
FIG. 2 depicts an exemplary suspension portion of the data storage device of FIG. 1.

FIG. 2 is an isometric view of an exemplary suspension (swing arm actuator) assembly 130 that can be used in the data storage device of FIG. 1. The suspension assembly 130 has a base 132 supporting a load beam 134 via a preload bend section 136. An HGA 138 is supported at the distal end of the load beam 134 and includes a data transducer (head) 140 gimbaled for multi-axial rotation along pitch (x-axis) and roll (y-axis) directions via a gimbal plate 142 and dimple (not separately shown).

The head 140 includes a slider having an air bearing surface (ABS) facing the associated media surface. The ABS interacts with fluidic currents established by high speed rotation of the media surface to hydrodynamically support the slider adjacent the surface. Such bearing surfaces are often referred to as air bearing surfaces even when a different fluid other than atmospheric air is retained within the housing 102 (e.g., an inert gas such as a helium). Read and write data transducing elements are mounted to the slider such as along a trailing edge thereof to transduce data from/to the media surface.

Figure 3A:
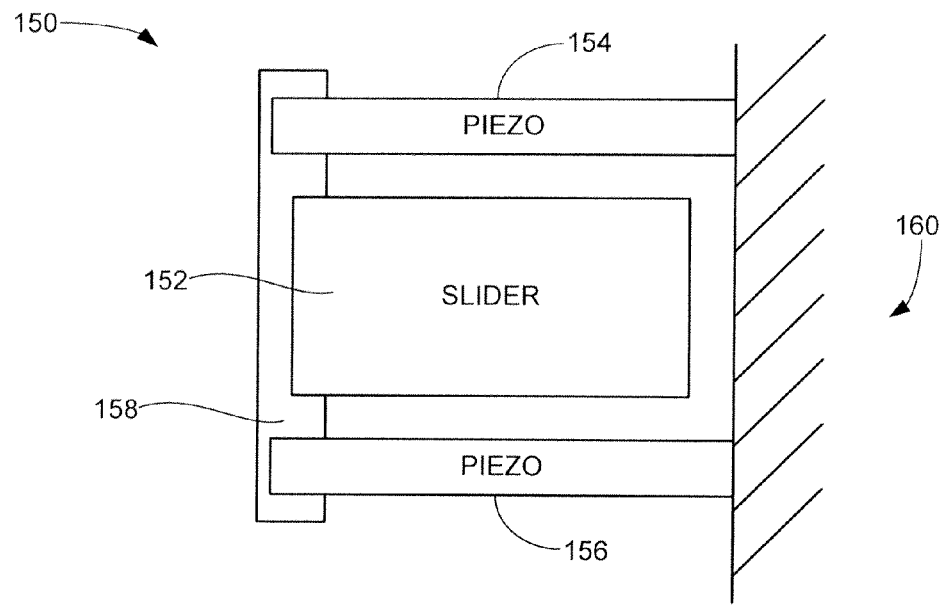
FIGS. 3A-3B illustrate exemplary operation of a microactuator assembly in accordance with various embodiments.

FIG. 3A depicts an HGA 150 that can be incorporated into the device suspension assembly 130 of FIG. 2. The HGA 150 includes a colocated microactuator structure with a slider 152 disposed between opposing first and second piezoelectric transducer (PZT) elements 154 and 156. The slider 152 and a first end of the PZT elements 154, 156 are respectively connected to a movable support member 158, also referred to herein as a gimbal island or a support bar. An opposing second end of the PZT elements 154, 156 is held in a substantially rigid fashion by a stationary support member 160.

Figure 3B:
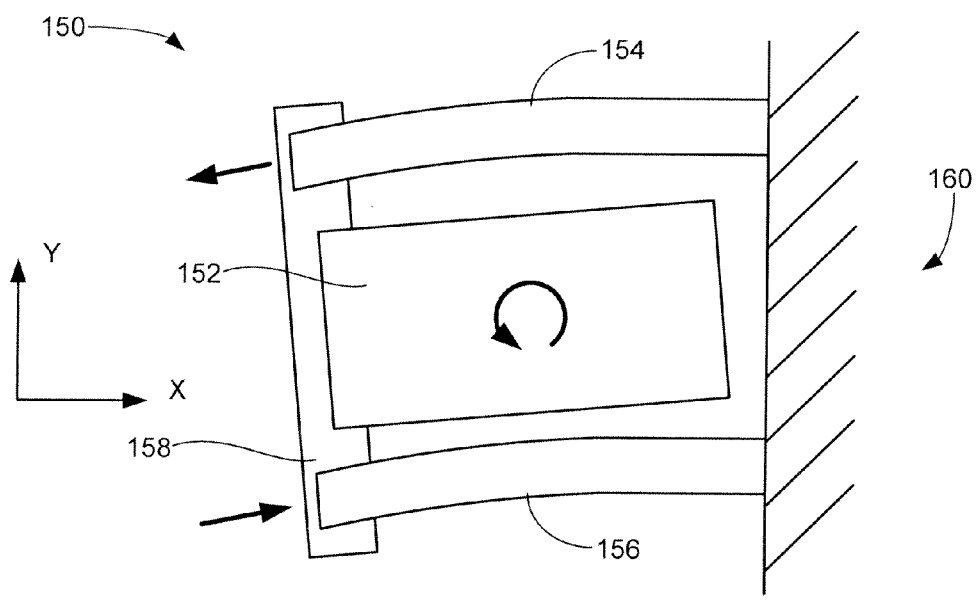

As shown in FIG. 3B, application of voltage control signals to the PZT elements 154, 156 induces respective expansion and contraction of the elements, which induces rotation of the slider 152. If the PZT elements were free along the ends opposite the support member 160, the elements would merely expand/contract along their respective lengths (e.g., along the X axis). The captured nature of the colocated microactuator structure translates to a bending mode of the PZT elements substantially in the XY plane as the slider is rotated. Some Z axis deflection, e.g. roll, may be experienced but such is negligible and compensated by other aspects of the suspension. The rotational motion of the slider 152 can be bi-directional (e.g., clockwise and counterclockwise, respectively) by reversing the applied input voltage control signals to the PZT elements.

FIGS. 4A-4D illustrate an exemplary HGA 160 configured to operate using the principles of FIGS. 3A-3B. A gimbal plate 162 has an aperture 164 that extends through the thickness of the plate 162. A gimbal island 166 is disposed within the aperture 164 of the gimbal plate 162, and is a separate member not mechanically coupled to the plate 162. That is, the gimbal island 166 is mechanically decoupled from the gimbal plate 162 to allow the island 166 to move independently of the plate 162 as will be discussed below.

Figure 4A:
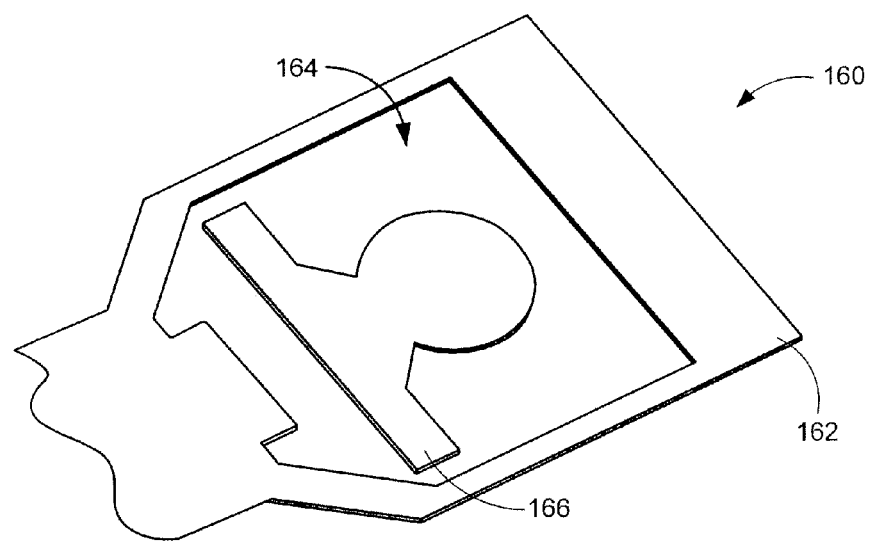
FIGS. 4A-4D provide an exemplary construction of a head gimbal assembly (HGA) in accordance with some embodiments.

At this point it will be noted that the term "decoupled" as used herein means a separate member that is physically detached from another member so as to be in non-contacting relation therewith and allow independent movement of the respective members. For example, the gimbal island 166 in FIG. 4A is decoupled from the gimbal plate 162 so that, as a separate component, it can rotate and deflect without inducing stress on the plate 162.

It should be noted that the size and shape of the gimbal island 166 and gimbal plate 162 are merely exemplary and can be varied as required. In some embodiments, the island 166 is configured to allow the maximum rotational movement of the center of the island 166. In other embodiments, portions of the gimbal plate 162 are adapted to allow maximum rotational movement of the gimbal island 166.

Figure 4B:
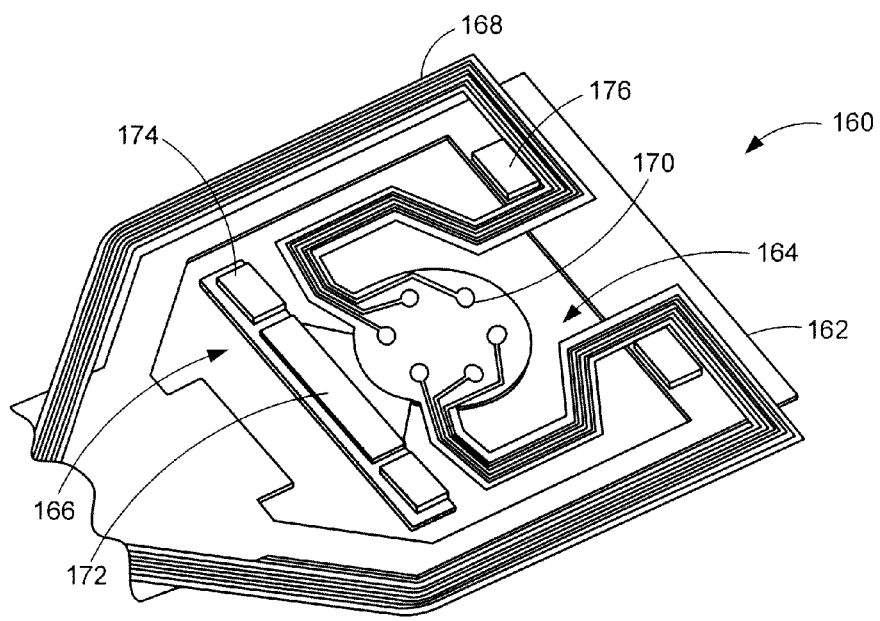

FIG. 4B illustrates attachment of a flex circuit 168 capable of transferring electric signals to electrodes 170 on the gimbal island 166. The gimbal island 166 is suspended by the flex circuit 168 while remaining decoupled from the gimbal plate 162. As such, movement of the gimbal island 166 will result in corresponding movement of at least a portion of the flex circuit 168. In some embodiments, the entire length of the flex circuit 168 is elastic and can maintain multiple circuit pathways that may correspond to independent circuits and interconnected circuits that are connected to components of the HGA 160 by one or more electrodes 170.

As shown, six independent circuits are located on the flex circuit 168 and have six corresponding electrodes 170 that can be electrically interconnected to a single component, such as a data transducing head, or multiple components, such as microactuators. The gimbal island 166 can have a first attachment pad 172 disposed between multiple second attachment pads 174 on a predetermined portion of the island 166. A pair of third attachment pads 176 are positioned on the gimbal plate 162 in alignment with the second attachment pads 174.

Figure 4C:
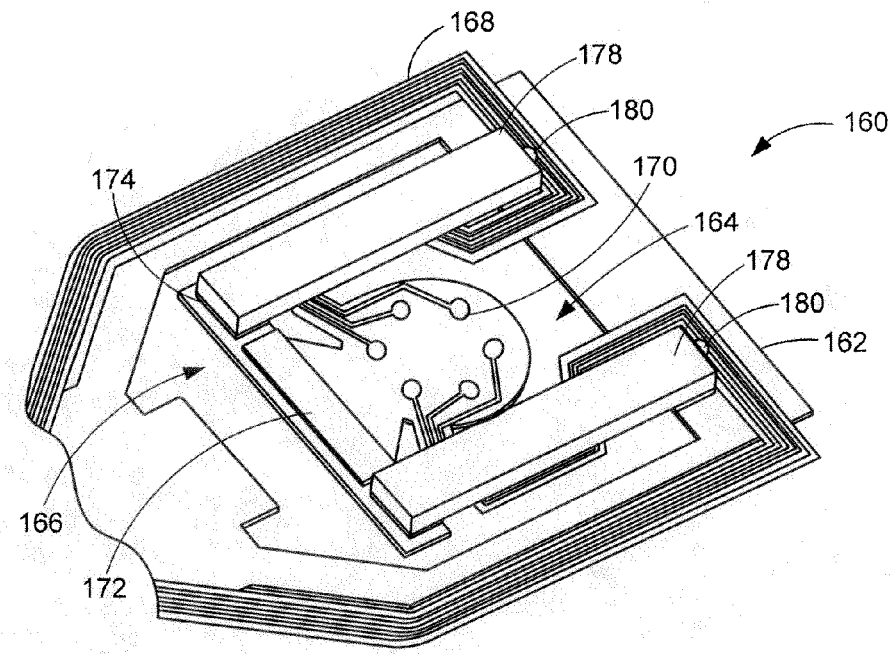
Figure 4D:
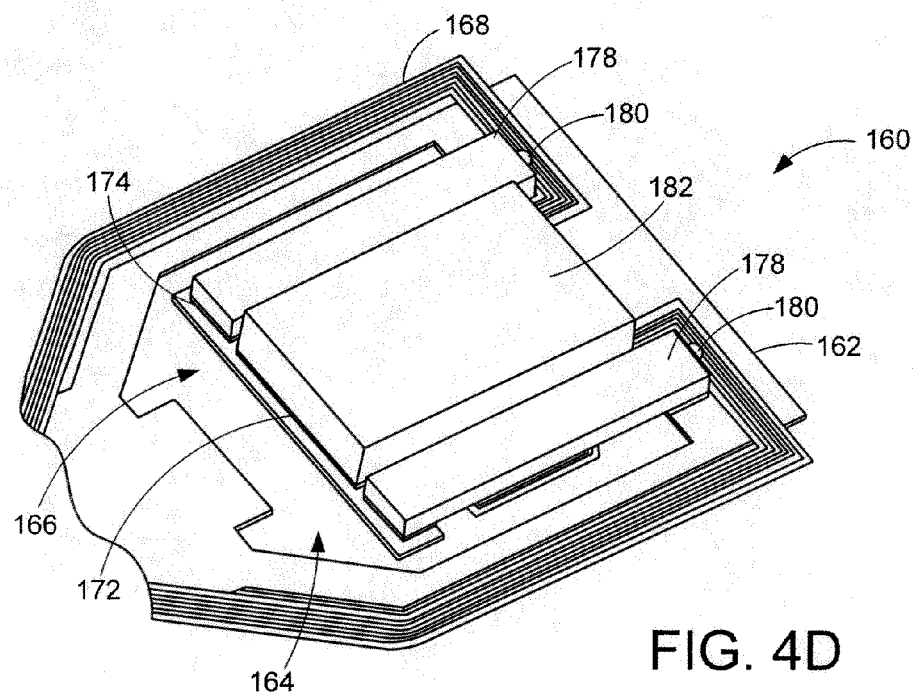

The configuration of the predetermined portion of the island 166 as well as the number and type of attachment pads are not limited to the embodiment shown in FIGS. 4B-4D and can be modified as desired without deterring from the spirit of the present disclosure. For example, the first attachment pad 172 can be an epoxy or other dielectric adhesive material while the second and third attachment pads 174 and 176 can be magnetic or physical fasteners.

In FIG. 4C, PZT elements 178 are connected to the second attachment pads 174 of the gimbal island 166 and the third attachment pads 176 of the gimbal plate 162. Each PZT element 178 is constructed of a piezoelectric material with both active and non-active PZT material layers, as explained below. Attachment of the PZT elements 178 to both the gimbal island and plate 166 and 162 can allow the island 166 to be deflected by corresponding movement of one or both of the PZT elements.

The gimbal island 166 remains mechanically decoupled from the gimbal plate 162 but has a cantilevered connection to the plate 162 through the PZT elements 178. As the PZT elements are activated, the gimbal island 166 will rotate and deflect, such as shown in FIG. 3B, while maintaining a mechanically decoupled relationship with the gimbal plate 166.

Such decoupled relationship is further maintained by connecting each PZT element directly to the flex circuit 168 with the node 180 that is positioned on the gimbal plate 162. With the flex circuit 168 configuration of FIGS. 4B-4D, the flex circuit 168 may deform as the gimbal island 166 rotates relative to the plate 162. However, the deformation of the flex circuit 168 does not stress or deflect the nodes 180 due to the decoupled relationship between the island and the plate 166 and 162. As such, a separate support component, such as an interposer, is unnecessary to establish the requisite electrical interconnections with the microactuators 178. Activation of the microactuators induces extension and/or contraction as previously discussed.

In some embodiments, the PZT elements 178 are positioned to operate in an extension mode during activation. Such extension can provide more stable and precise gimbal island 166 actuation as compared to prior orientations that place the microactuators on their sides with the height surface abutting the attachment pads.

FIG. 4D further shows the HGA 160 to include an attached transducer to the first attachment pad 172 of the gimbal island 166 and connecting the various electrodes 170 (not shown) to the slider 182. As can be appreciated, the transducer includes a slider 182 with an air bearing surface and can include a number of magnetic and/or optical transducing components having the capability to read data from and/or write data to a storage medium.

The attachment of the slider 182 to the various electrodes 170 and not any portion of the gimbal plate 162 allows for the slider to rotate and deflect in a mechanically decoupled relationship with the plate 162. Such decoupled configuration provides that the PZT elements 178 can quickly and easily deflect the gimbal island 166 and slider 182 due to the lack of any spring force resistance or inertia that must be overcome if a support frame was present that was mechanically coupled to the gimbal plate 162.

Figure 5:
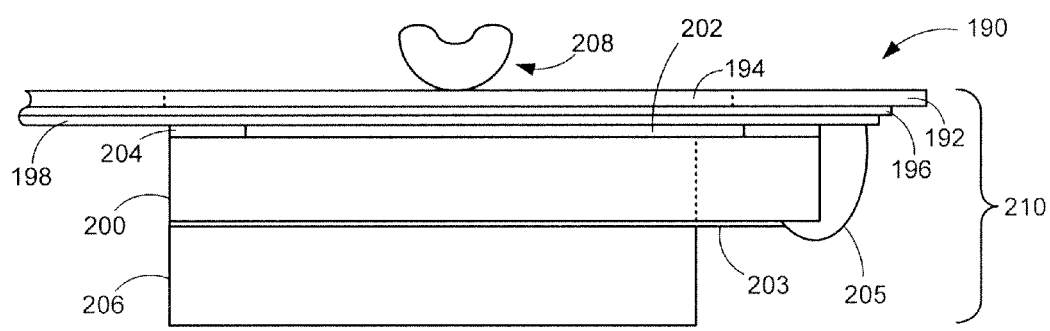
FIG. 5 shows side plan view of another HGA in accordance with some embodiments.

FIG. 5 generally illustrates a side view of an exemplary HGA 190 in accordance with various embodiments of the present disclosure. The HGA 190 is similar to the HGAs discussed above and includes a gimbal plate 192 ("stationary support member") with an aperture (not shown) in which a gimbal island 194 ("movable support member" or "support bar") is disposed, as shown by segmented lines in the plate 192. A flex circuit 196 is positioned adjacent the gimbal plate and island 192 and 194 and provides independent circuits in the form of electrical traces 198.

A colocated microactuator with opposing PZT elements 200 is attached to both the gimbal plate and island 192 and 194 with a top microactuator electrode 202 and bottom microactuator electrode 203 each electrically connected to one or more traces 198 of the flex circuit 196. The top electrode can be electrically connected via node 204 and the bottom electrode can be electrically connected via node 205.

Figures 6A, 6B:
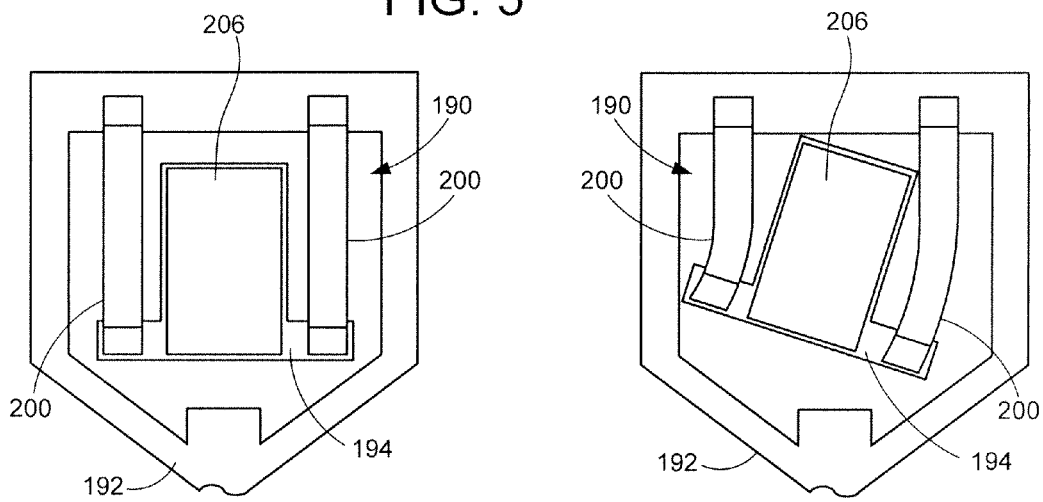
FIGS. 6A-6B provide plan views of the HGA of FIG. 5.

As further shown in FIGS. 6A-6B, the slider 206 is attached to the gimbal island 194 between the opposing PZT elements 200. Control signals can be supplied to the PZT elements via the aforementioned flex circuit and electrodes.

The suspension of the HGA 190 and specifically the gimbal island 194 with the dimple 208 further reduces the preload stress on the microactuators 200 by directly carrying the load of the slider 206. Such reduction in preload stress can allow the microactuator structure to endure operational shock without degrading abuse or resulting damage.

Figure 7:
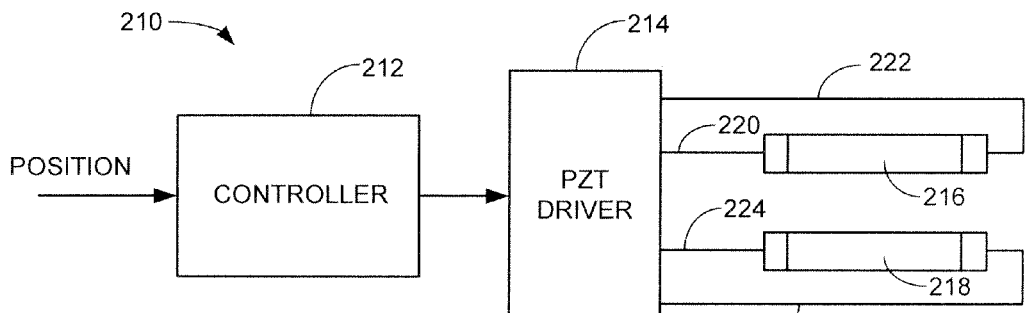
FIG. 7 is a functional block representation of control circuitry adapted to actuate the piezoelectric transducer (PZT) elements of FIGS. 3-6B.

FIG. 7 is a functional block diagram of control circuitry 210 adapted to apply voltage control signals to a microactuator structure such as described above in FIGS. 3-6. A controller 212 receives a position signal indicative of a desired position for an active portion (e.g., read or write element) of an HGA. The position signal may be a position error signal, a position correction signal, etc. The controller provides a corresponding input signal to a PZT driver circuit 214, which in turn applies voltage control signals to respective PZT elements 216, 218 via associated conductive paths 220, 222 and 224, 226. The voltages may be equal and opposite direct current (dc) voltages, or may have specifically adjusted magnitudes that vary over time such as in the case of a time-varying voltage profile.

Figure 8:
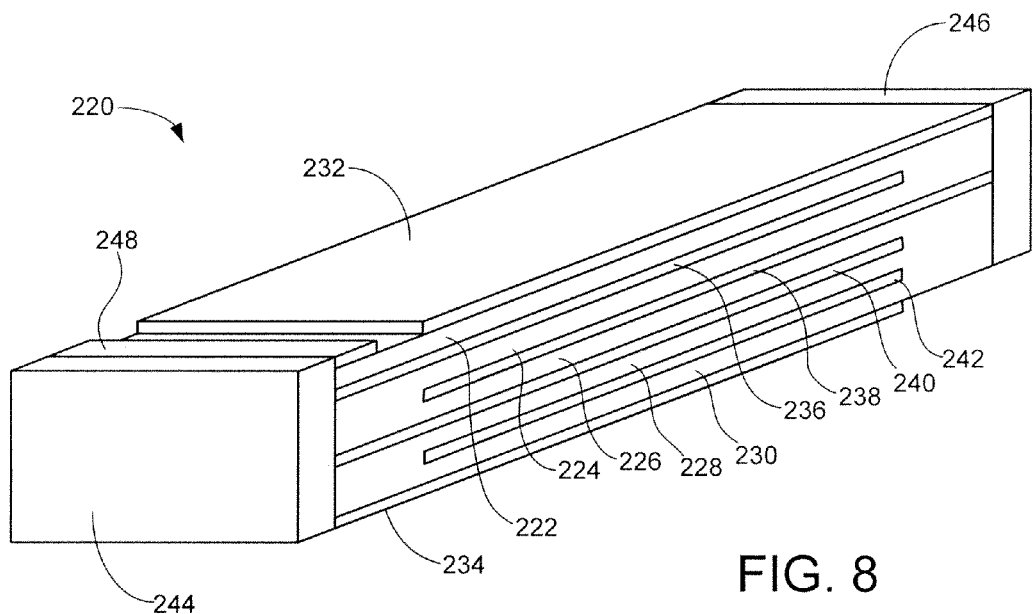
FIG. 8 is an isometric depiction of another PZT element in accordance with some embodiments.
Figure 9:
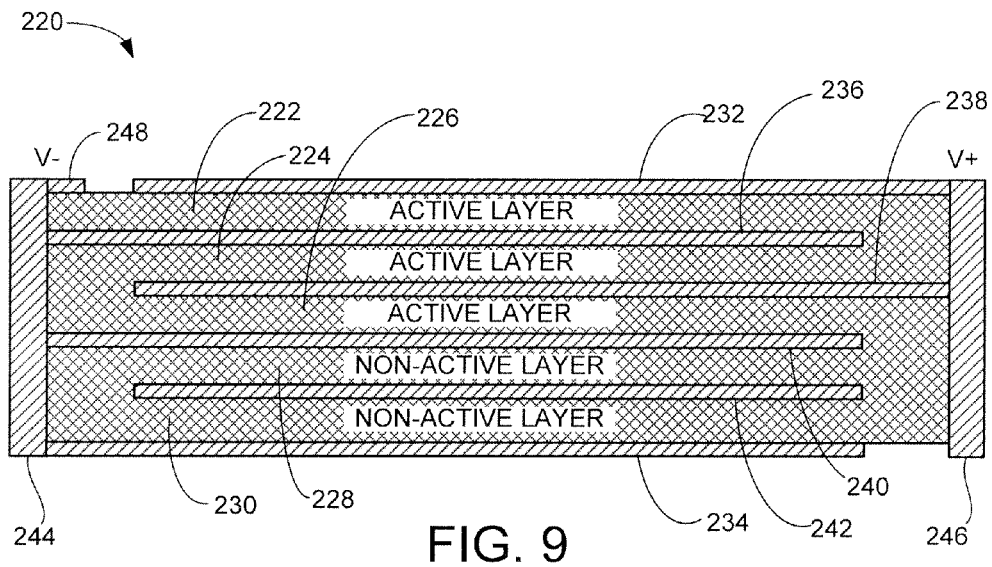
FIG. 9 provides a cross-sectional representation of the PZT element of FIG. 8.

FIG. 8 is an isometric depiction of a PZT element 220 constructed in accordance with some embodiments. FIG. 9 generally depicts the PZT element 220 in cross-section. It will be appreciated that the various relative dimensions and aspect ratios set forth in the drawings are merely representative and are not necessarily drawn to scale.

The PZT element 220 takes a multi-layer stacked configuration with a plurality of layers of PZT material interposed with relatively thin conductive layers. More specifically, the PZT element 220 has a 3/2 configuration with three (3) active PZT layers 222, 224 and 226 and two (2) non-active PZT layers 228, 230.

Conductive layers include a top conductor 232, bottom conductor 234, and intermediate conductors 236, 238, 240 and 242. The conductors are respectively interconnected with a selected one of a first end-cap electrode 244 and a second end-cap electrode 246 as shown. An exception is floating conductor 242, which is not connected to either end-cap electrode 244 or 246.

A relatively small end-cap conductor 248 may also be provisioned adjacent the first end-cap electrode 244. While the first end cap electrode 244 is shown to be set at an applied negative voltage (V−) and the second end cap electrode 246 is shown to be set at an applied positive voltage (V+), it will be appreciated that the respective polarities will be reversed depending on whether expansion or contraction modes are desired.

It can be seen from the applied voltages in FIG. 9 that each of the active layers 222, 224 and 226 is sandwiched between a respective pair of conductors at different voltage potentials. That is, top active layer 222 is between top conductor 232 at V+ and intermediate conductor 236 at V−. Active layer 224 is between conductor 236 (V−) and conductor 238 (V+). Active layer 226 is between conductor 238 (V+) and conductor 240 (V−).

The non-active layers 228, 230 are not between active conductors at different potentials, but instead are bounded by intermediate conductor 240 (V−) and lower conductor 234 (also at V−), each of which extend substantially the overall length (e.g., 90% or more) of the non-active layers. While the lower conductor 234 is not necessarily required, inclusion of this latter conductor allows the stack of non-active layers to be affirmatively bounded by the same selected voltage (e.g., V− in FIG. 9), ensuring the layers remain inactive do not activate in like manner as the active layers in response to the application of the control voltages to the end-cap electrodes.

Each of the active and non-active layers are shown to have substantially the same thickness (in the Z direction), although such is not necessarily required. It is contemplated that the active layers will be closest to the gimbal (e.g., on top as viewed in FIG. 5), although other orientations can be used including respective alternating layers of active and inactive layers.

Figure 10:
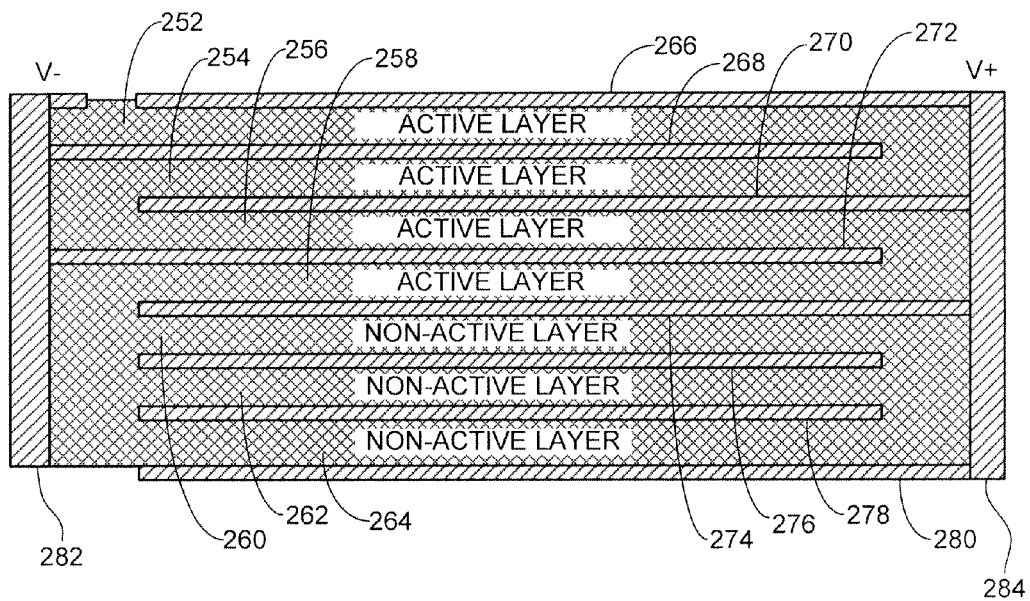
FIG. 10 is a cross-sectional representation of another PZT element.

FIG. 10 provides an alternative PZT element 250 that utilizes a 4/3 configuration having four (4) active layers 252, 254, 256 and 258 and three (3) non-active layers 260, 262 and 264. Intervening conductors 266-280 are provided as shown which, except for floating conductors 276 and 278, respectively interconnect with end-cap electrodes 282.

Figure 11:
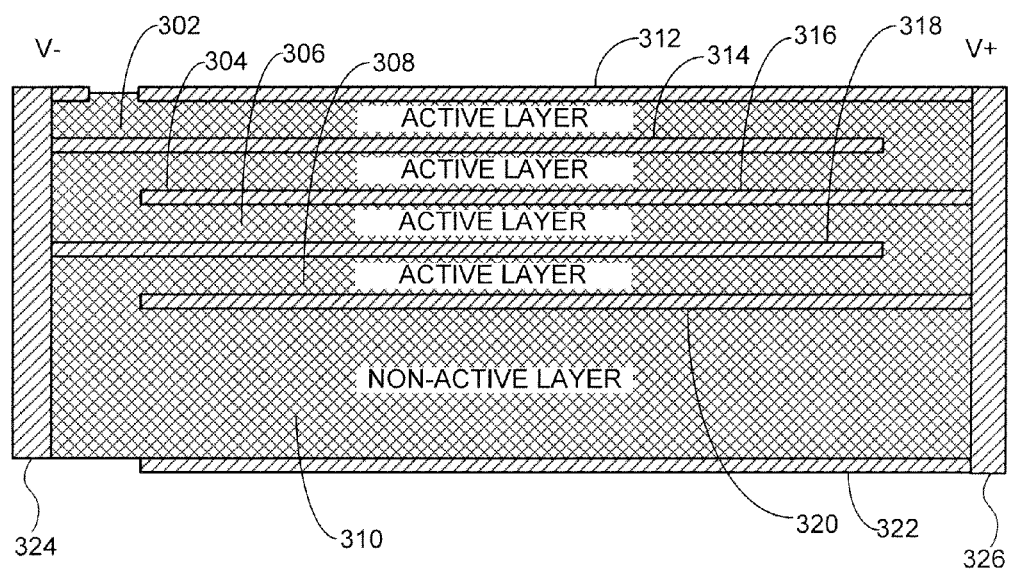
FIG. 11 is a cross-sectional representation of yet another PZT element.

FIG. 11 provides another alternative PZT element 300 that uses a 4/1 configuration with four (4) active layers 302, 304, 306 and 308 and a single one (1) non-active layer 310. Intervening conductors 312-322 are arranged as shown to interconnect with end-cap electrodes 324 and 326. It will be noted that the PZT element 300 in FIG. 11 is substantially similar to PZT element 250 in FIG. 10 except for the omission of the floating conductors 276 and 278. Other configurations are readily envisioned having different respective numbers of active and non-active PZT material layers, and such other configurations and can be readily constructed in view of the present disclosure.

It has been found that multi-layer PZT elements as represented in FIGS. 8-11 can have significantly improved displacement characteristics as compared to multi-layer configurations with all active PZT material layers. In one example, a 3/2 design similar to the PZT element 220 in FIGS. 8-9 was found to have a stroke (expansion/contraction output such as in nanometers/volt, nm/V) that was about 70% greater (1.7x) than the stroke of a corresponding 5/0 design in which all five layers were active.

It is believed that this unexpected improvement in stroke performance through the use of inactive layers may relate to the ability of the non-active layers to accommodate the additional stresses that are induced into the PZT element during the bending mode of operation of the colocated microactuator environment. The inactive layers are believed to cause the PZT elements to naturally bend, and this natural bending matches the bending in the constrained state. The use of one or more non-active PZT material layers as disclosed herein appears to reduce the stresses within the stack, and the generation of electrical potential in the non-active layers induced by the bending mode tends to increase the efficiency of the applied control signal to the active layers.

The inclusion of the non-active layers thus enables a designer to substantially match the natural bending state of the material to the actual bending mode experienced by the constrained system when applying a 3-1 mode control effort (e.g., expansion along the longest length of the PZT element). The stacked nature of the exemplary embodiments provides simplified manufacturing processes over more complex processes such as thin film PZT on wafer and wafer-bonded PZT designs. The use of a common PZT layer thickness allows the respective ratio of active to non-active layers to be easily achieved using a high volume manufacturing process.

While various embodiments disclosed herein are directed to the environment of a hydrodynamically supported data transducer, it will be appreciated that the embodiments can be adapted to any number of other environments in which a bending mode of operation is desirable using a PZT element, including applications that involve a single PZT element that is constrained to impart rotational deflection to a control object.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising:
   a control object; and
   a piezoelectric transducer (PZT) element adapted to induce rotational displacement of the control object in a bending mode of operation, the PZT element comprising a plurality of piezoelectric material layers and a plurality of electrically conductive layers interposed between the piezoelectric material layers, the piezoelectric material layers comprising a first subset of active layers and at least one non-active layer.

2. The apparatus of claim 1, in which the at least one non-active layer of the piezoelectric material layers is bounded by opposing first and second electrically conductive layers each having an overall length substantially equal to the overall length of the at least one non-active layer.

3. The apparatus of claim 1, further comprising first and second end-cap electrodes at opposing ends of the piezoelectric material layers so that a first subset of the electrically conductive layers is electrically interconnected with the first end cap electrode at a first voltage potential, a second subset of the electrically conductive layers is electrically interconnected with the second end cap electrode at a different, second voltage potential, and a third subset of the electrically conductive layers is not interconnected to either of the first and second end cap electrodes.

4. The apparatus of claim 1, in which a first end of the PZT element is rigidly affixed to a base, and an opposing second end of the PZT element is rigidly affixed to the control object and constrained so that expansion or contraction of the PZT element responsive to application of a control potential induces a bending mode of operation of the PZT element and rotation of the control object.

5. The apparatus of claim 1, in which the PZT element is characterized as a first PZT element, the apparatus further comprises a second PZT element nominally identical to the first PZT element, the first and second PZT elements arranged on opposing sides of the control object such that expansion of the first PZT element and concurrent contraction of the second PZT element induces bending of both elements and rotation of the control object.

6. The apparatus of claim 5, further comprising a free-body support bar to which a first end of each of the first and second PZT elements, and the control object, are affixed.

7. The apparatus of claim 5, in which the control object is a data transducer of a head gimbal assembly (HGA), in which the apparatus further comprises a rotatable data storage medium, and in which the first and second PZT elements provide microactuation positioning of the data transducer adjacent the storage medium.

8. The apparatus of claim 1, further comprising a stationary support member adapted to rigidly affix a first end of each of the first and second PZT elements, and a support bar adapted to rigidly affix an opposing second end of each of the first and second PZT elements and to rigidly affix the data transducer therebetween, wherein responsive to a control signal to expand the first PZT element and to concurrently contract the second PZT element, the first and second PZT elements concurrently bend to rotate the support bar about a central rotational point.

9. The apparatus of claim 1, further comprising a rotatable data storage medium, wherein the first and second PZT elements provide microactuation positioning of the data transducer adjacent the storage medium.

10. The apparatus of claim 1, in which the first subset of active layers and the at least one non-active layer each have a common overall thickness.

11. An apparatus comprising:
    a data transducer; and
    first and second piezoelectric transducer (PZT) elements arranged on opposing sides of the data transducer to form a colocated microactuator structure that induces rotation of the data transducer responsive to a bending mode of operation as the PZT elements respectively expand and contract, each of the first and second PZT elements comprising a plurality of piezoelectric material layers each having a common thickness and a plurality of electrically conductive layers interposed between the piezoelectric material layers, the piezoelectric material layers comprising a first subset of active layers and at least one non-active layer.

12. The apparatus of claim 11, in which the piezoelectric material layers comprise a first plural number of said active layers and a second plural number of said non-active layers, the second plural number less than the first plural number.

13. The apparatus of claim 11, further comprising a stationary support member and a moveable support member, the stationary support member rigidly supporting respective first ends of the first and second PZT elements, the moveable support member rigidly supporting respective opposing second ends of the first and second PZT elements and the data transducer.

14. The apparatus of claim 11, in which the at least one non-active layer of the piezoelectric material layers is bounded by opposing first and second electrically conductive layers each having an overall length substantially equal to the overall length of the at least one non-active layer.

15. The apparatus of claim 11, in which each of the first and second PZT elements further comprises first and second end-cap electrodes at opposing ends of the piezoelectric material layers so that a first subset of the electrically conductive layers is electrically interconnected with the first end cap electrode at a first voltage potential, a second subset of the electrically conductive layers is electrically interconnected with the second end cap electrode at a different, second voltage potential, and a third subset of the electrically conductive layers is not interconnected to either of the first and second end cap electrodes.

16. An apparatus comprising:
a colocated microactuator structure comprising a stationary first support member, a moveable second support member, and first and second piezoelectric transducer (PZT) elements respectively connected in spaced-apart parallel fashion between the first and second support members, each of the PZT elements comprising a stack of piezoelectric material layers with interposing conductive layers therebetween, the stack of piezoelectric material layers comprising a first plural number of active layers and a second plural number of non-active layers;
a data transducer supported by the moveable second support member between the first and second PZT elements; and
a control circuit adapted to apply control voltages to the first and second PZT elements to induce a bending mode of operation therein and impart rotational movement of the data transducer adjacent the medium.

17. The apparatus of claim 16, in which the control circuit applies a first voltage potential to the first PZT element and a different second voltage potential to the second PZT element to concurrently induce expansion of the first PZT element and contraction of the second PZT element thereby bending both the first and second PZT elements to rotate the transducer.

18. The apparatus of claim 16, in which the second plural number of non-active layers are bounded by opposing first and second electrically conductive layers each having an overall length substantially equal to the overall length of the at least one non-active layer.

19. The apparatus of claim 16, in which each of the first and second PZT elements further comprises first and second endcap electrodes at opposing ends of the piezoelectric material layers so that a first subset of the electrically conductive layers is electrically interconnected with the first end cap electrode at a first voltage potential, a second subset of the electrically conductive layers is electrically interconnected with the second end cap electrode at a different, second voltage potential, and a third subset of the electrically conductive layers disposed between the second plural number of non-active layers are not interconnected to either of the first and second end cap electrodes.

20. The apparatus of claim 16, in which the first plural number is greater than the second plural number.

* * * * *